United States Patent [19]

Li

[11] Patent Number: 4,626,711
[45] Date of Patent: Dec. 2, 1986

[54] EXCLUSIVE OR GATE CIRCUIT

[75] Inventor: Gabriel M. Li, San Francisco, Calif.

[73] Assignee: National Semiconductor Corporation, Santa Clara, Calif.

[21] Appl. No.: 609,368

[22] Filed: May 11, 1984

[51] Int. Cl.[4] .................. H03K 19/21; H03K 19/092; H03K 19/013
[52] U.S. Cl. .................................... 307/471; 307/270; 307/458
[58] Field of Search ............... 307/471, 472, 270, 443, 307/445, 456, 458, 459, 299 A; 371/49

[56] References Cited

U.S. PATENT DOCUMENTS

| | | | |
|---|---|---|---|
| 3,821,719 | 6/1974 | Taniguchi et al. | 307/299 A X |
| 4,251,884 | 2/1981 | Baun, Jr. | 307/471 X |
| 4,355,246 | 10/1982 | Usui | 307/456 |
| 4,413,195 | 11/1983 | Birch | 307/456 |
| 4,504,744 | 3/1985 | Balakrishnan | 307/458 X |

FOREIGN PATENT DOCUMENTS

| | | | |
|---|---|---|---|
| 68065 | 6/1978 | Japan | 307/471 |
| 85146 | 7/1978 | Japan | 307/471 |

OTHER PUBLICATIONS

Palmieri et al, "Exclusive OR Circuit", IBM Tech. Discl. Bull., vol. 13, No. 5, p. 1074, Oct. 1970.

Primary Examiner—Stanley D. Miller
Assistant Examiner—David R. Bertelson
Attorney, Agent, or Firm—Gail W. Woodward; Paul J. Winters

[57] ABSTRACT

An exclusive-or circuit which is extremely fast, uses lower power and fewer components, and is easier to manufacture than prior art circuits is achieved in a circuit which uses only a single reference voltage potential (shown as positive) in the portion of the circuit which generates exclusive-nor logic, and uses a feedback transistor to prevent saturation of a switching transistor. In the off state of the switching transistor, the single reference potential causes the base to be several saturation potentials above ground. In the on state, the feedback transistor reduces the base current. Thus the voltage swing between on and off states is less than in prior art circuits. In addition, the logic from many input signals can be combined to create a single exclusive-nor signal before buffering to an exclusive-or signal at the output terminal.

4 Claims, 11 Drawing Figures

FIG.4b₁

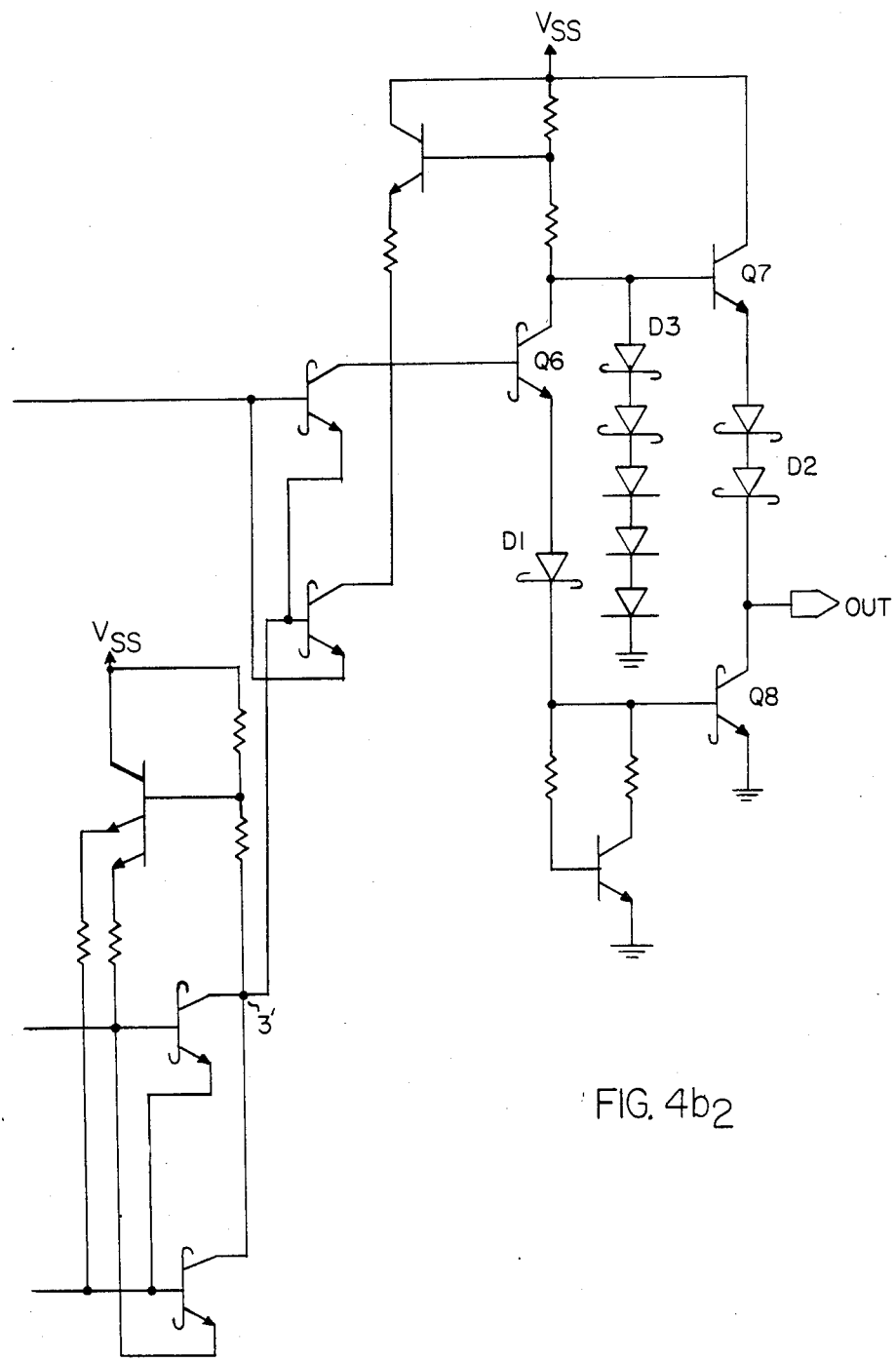
FIG. 4b₂

| XOR GATES | 2 INPUTS | 3 INPUTS | 4 INPUTS | 16 INPUTS |
|---|---|---|---|---|
| NO. OF RESISTORS | 14 | 28 | 42 | 210 |
| NO. OF TRANSISTORS | 17 | 34 | 51 | 255 |
| $t_{pd}$ (ns) | 5 | 10 | 10 | 20 |
| LOGIC REPRESENTATION |  |  |  | FIG. 5 |

PERFORMANCE TABLE

| XOR GATES | 2 INPUTS | 3 INPUTS | 4 INPUTS | 16 INPUTS |
|---|---|---|---|---|
| NO. OF RESISTORS | 7 | 10 | 11 | 55 |
| NO. OF TRANSISTORS | 9 | 15 | 16 | 80 |
| $t_{pd}$ (ns) | 3.5 | 4.5 | 4.5 | 9 |
| LOGIC REPRESENTATION |  |  |  | FIG. 6 |

PERFORMANCE TABLE

EXCLUSIVE OR GATE CIRCUIT

BACKGROUND OF THE INVENTION

1. Field of the Invention

This invention relates to an exclusive-or gate circuit suitable for use as a parity bit generator in an integrated circuit, and in particular, to an exclusive-or gate with increased packing density, increased speed and lower power consumption over prior art circuits and which is easier to manufacture than prior art circuits.

2. Description of the Prior Art

Exclusive-or gates with two input leads generate a logical "0" output signal if two input signals have the same state (logical "0" or logical "1") and generate a logical "1" output signal if two input signals have different states. Successive stages of exclusive-or circuitry can be combined to generate an exclusive-or output signal for any number of input signals with the result that a logical "0" is generated if an even number of inputs are logical "1" and a logical "1" is generated if an odd number of inputs are logical "1".

Circuits for generating exclusive-or logic are well-known. The two-input exclusive-or circuit of conventional prior art shown in FIG. 1a must generate an inverted signal from the signal from each input terminal and combine the inverted signal from one terminal with the noninverted signal from the other terminal, in a double-emitter transistor, and then combine the signals from the two double-emitter transistors to generate a single exclusive-or signal.

According to the prior art, the number of stages needed to generate a single exclusive-or output signal is the base-2 logarithm, rounded upward, of the number of input terminals to be used.

A typical inverter circuit of the prior art is shown within the smaller dotted lines of FIG. 1a. This inverter requires large silicon area for its five semiconductor components and four resistors and introduces three propagation gate delays into the circuit associated with the inversion of a transistor. In addition, the exclusive-NOR circuitry, according to the prior art, as shown in section 10 of FIG. 1a, continuously draws current from the first to second voltage potentials (i.e., from supply voltages to ground) or from the first potential to a low-state input terminal.

This prior art exclusive-or circuit feeds the inverted signal from first input terminal $\overline{A}$ and the noninverted signal from a second input terminal B to corresponding terminals of the dual emitters of a transistor Q9 operating as a diode. Transistor Q9 has its base connected through a resistor to a first voltage potential and its collector, which is shorted to its own base, connected to the base of a further transistor Q11. Likewise, this prior art circuit feeds the inverted signal from the second input terminal, $\overline{B}$, and the noninverted signal from the first input terminal, A, to corresponding terminals of the dual emitters of transistor Q10, also connected as a diode. Transistor Q10 also has its base connected through a resistor to a first voltage potential and its collector, which is shorted to its own base, connected to the base of a further transistor Q12. The emitters of these further transistors Q11 and Q12 are connected to a second voltage potential (shown as ground) through a diode Q13 which provides a potential difference to control the turn-on-turn-off level, and the collectors of Q11 and Q12 are connected to a phase splitter transistor Q14 which controls the operation of pull-up and pull-down transistors Q15, Q16 to the output terminal.

The circuit of FIG. 1a draws power from the high voltage potential to the low potential through transistors Q11 or Q12 if one or both are on, and through transistors Q9 and/or Q10 continuously (i.e., whether or not signals A and B are the same or different).

A variety of configurations for controlling the output signal from the phase splitter transistor are known and used. Two arrangements are shown in the accompanying figures, one in FIGS. 1, 2, and 4 and a second in FIG. 3.

If a third input signal is to be used, the output signal from the circuit shown in FIG. 1 is generated for two of the input signals and combined with a third input signal in a complete second stage, to generate a signal exclusive-or signal. This arrangement doubles the switching time of a two-input circuit, by the addition of a complete second stage. For four input signals, two groups are formed generating two first stage output signals which are combined in a second stage to generate a single output signal. Five through eight input signals employ a third stage, and so on, the number of stages being equal to the base-2 logarithm, rounded upward to the next integer, of the number of input signals to be simultaneously processed. As noted in FIG. 7, the time delay from input to output is typically 5 nanoseconds for a 2 input circuit and 20 nanoseconds for a 16 input circuit.

Another circuit of the prior art is shown in FIG. 1b. In FIG. 1b transistors Q3 and Q4 can comprise standard NPN transistors or Schottky clamped NPN transistors. As shown in FIG. 1b the collector of transistor Q3 is connected through a pull-up resistor to voltage supply $V_{ss}$. The emitter of transistor Q3 is connected to the emitter of transistor Q2 which has its base connected through a resistor to $V_{ss}$. The emitter of Q2 is also connected to input terminal B while the collector of transistor Q2 is connected to the base of switching transistor Q4. The collector of Q4 is connected to the collector of Q3 and to a node C. The emitter of transistor Q4 is connected to the emitter of a second switching transistor Q1 which has its base connected through a resistor to $V_{ss}$ and is also connected to input terminal A. The collector of switching transistor Q1 is connected to the base of Q3.

In operation, a high level signal on input terminal A and a low level signal on input terminal B results in transistor Q1 being biased off and transistor Q2 being biased on. Transistor Q3 is then turned on by the high level voltage on its base and the low level signal on input terminal B. The low level signal on the emitter of Q2 is applied to the base of transistor Q4 thereby biasing transistor Q4 off. If both input signals A and B are on or off, transistors Q3 and Q4 will not have their base-emitter junctions forward biased and will therefore be off. The result is that the output signal on output lead C represents an exclusive-NOR function. One problem with this circuit of the prior art is that the voltage on the collectors of switching transistors Q3 and Q4 makes the full swing from supply voltage $V_{ss}$ to almost ground. This makes the circuit much slower than desire for high speed VLSI applications. Also, connecting the emitters of Q3 and Q4 to the input terminals B and A respectively results in the voltages on the emitters of these two transistors swinging between the high and low levels of the input signals on terminals A and B. This again slows down the operation of the circuit. Furthermore, all four transistors and accompanying resistors must be replicated for multiple inputs.

SUMMARY

The circuit of this invention in response to signals from a selected number of input terminals generates a single exclusive-or signal for transmission to an output terminal for use in generating signals for transmission to further stages of exclusive-or logic or for use in other utilization circuits.

In accordance with this invention, a number of improvements are provided over prior art. The circuit design of this invention applies input data signals to two (rather than one) terminals of the switching transistors which are used to provide the exclusive-or logic. One of the prior art circuits (FIG. 1b) also uses this two-terminal feature. However, this invention connects the circuit to provide a smaller voltage drop in response to a low input signal than the prior art circuit just described. No inverter circuits are used and the components which generate exclusive-or logic are not connected to a second potential. Another improvement is a feedback circuit which increases switching speed and reduces power. A further improvement incorporates logic from more than two input signals to generate a single output signal, thus using only one stage of output circuitry, furthermore, the circuit of this invention incorporates multiple input signals in successive sub-stages without having to replicate the four-transistor unit of FIG. 1b.

In accordance with this invention a single output signal from a single stage of exclusive-or circuitry is capable of being generated from up to a selected number of input signals, however, the essence of the first improvement over prior art will be described in terms of two input signals. The circuit of this invention processes the input signal through a transistor which has its base connected to a first voltage source. The processed signal from the first input terminal is connected to the base of a first transistor and the emitter of a second transistor. The signal from a second input terminal is also processed through a transistor which has its base connected to the first voltage source. The processed signal from the second input terminal is connected to the base of said second transistor and the emitter of said first transistor. The collectors of said first and second transistors are connected to a node which exhibits exclusive-NOR logic, as follows: if both input signals are high, said first and second transistors experience no drop in potential from base to emitter; thus they are off and the voltage at the node remains high. Likewise, if both input signals are low, said first and second transistors experience no drop in potential from base to emitter, therefore they are off and again the voltage at the node remains high. But if the first input signal is high and the second signal is low, current can pass through said first transistor and out through the second input terminal. Likewise if the first input signal is high and the second input signal is low, current can pass through said second transistor and out through the first input terminal. In these cases, voltage at the node is low. Therefore exclusive-NOR logic is achieved at the node.

The second improvement of this invention makes use of a feedback transistor to reduce voltage swing and current flow at a selected node in the system. This node is connected to the base of a transistor which is to be switched rapidly from one to another state. According to the teachings of this invention, the emitter of the feedback transistor is connected through a resistor to the base of the transistor to be quickly switched and the base of the feedback transistor is connected to a voltage divider node which is connected through a resistor to a positive voltage supply, and through another resistor to the collector of the transistor to be quickly switched. The collector of the feedback transistor is connected to the positive voltage supply. During an on-state of the transistor to be switched, this arrangement produces a small feedback current which allows for quick turn-off of the transistor to be switched in response to a deceased voltage to the base of the transistor. During an off-state of the transistor to be switched, the feedback transistor carries a higher current which is available at the instant of increasing voltage at the base of the transistor to be switched to quickly turn it on. This same improvement can be used to provide feedback to more than one switching transistor using a multiple-emitter feedback transistor.

The third improvement of this invention occurs when a circuit configuration having more than two input signals is to be used. According to the teachings of this invention, the number of stages needed to generate a single exclusive-or output signal is the base-4 or even base-8 logarithm, rounded upward, of the number of input terminals. (A stage, as used herein, consists of the circuitry needed to produce exclusive-or logic plus the circuitry to buffer the signal to the output terminal. A stage is the structure shown for example in FIG. 2. Likewise FIG. 3 represents a stage and FIG. 4 represents a stage. Looking to FIG. 2 a sub-stage would be that portion of the circuitry consisting of transistors Q1, Q3, Q2, Q4 and resistors R1 and R2. The output of the sub-stage is at node 1.) Input signals from a third and fourth source can be combined with the first two signals to produce a single exclusive-NOR signal which is buffered to produce the exclusive-or signal to the output terminal of the circuit. Thus the time delay and number of components needed to provide exclusive-or logic from three, or four, or more input signals is reduced relative to the prior art.

Thus, the exclusive-or logic is obtained with fewer component parts, smaller silicon area, higher speed, and lower power.

DETAILED DESCRIPTION

This invention will be described in conjunction with three embodiments. It should be understood, however, that this description is illustrative only and is not meant to limit the scope of the invention. As part of the description the values of resistors used in one embodiment of this invention will be placed in parentheses following the first reference to that component.

Figure 2:
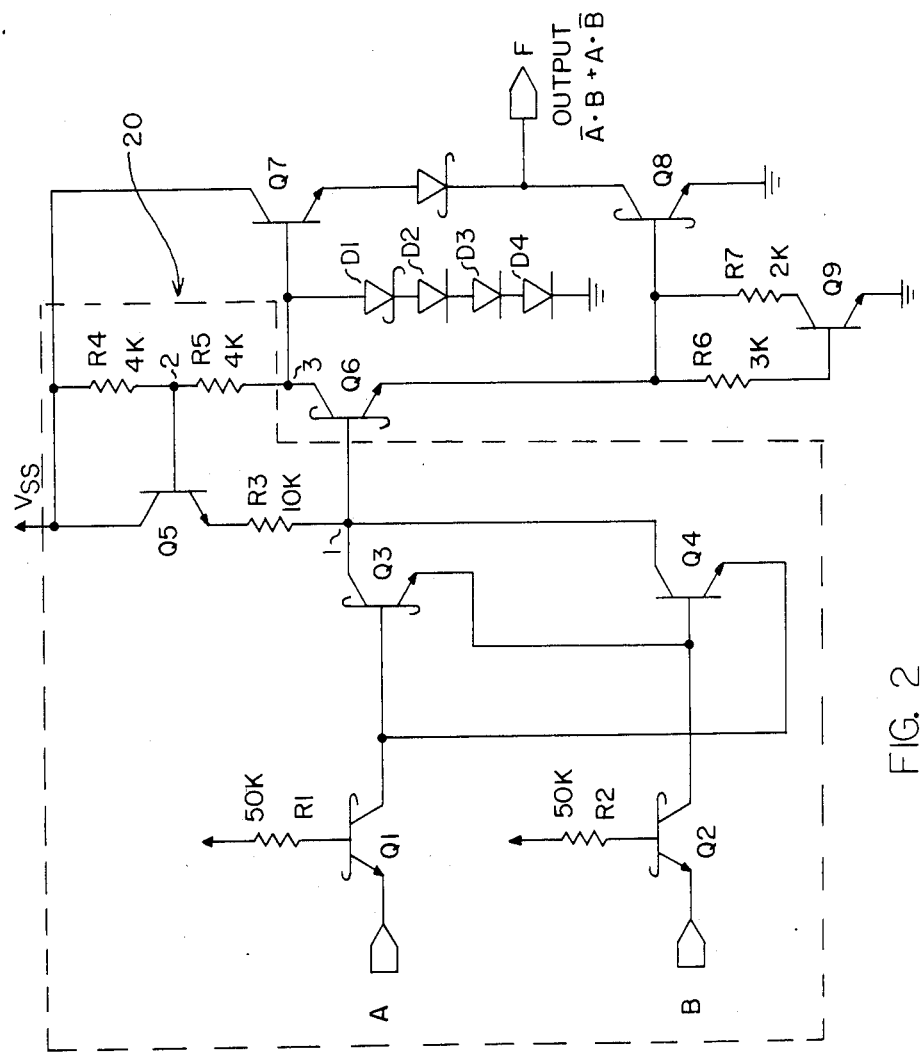
FIG. 2 shows a two-input embodiment of this invention which makes use of the more efficient circuit logic and the feedback transistor of this invention.

In accordance with a two input embodiment of this invention, as shown in FIG. 2, a first input signal A is applied to the emitter of an NPN transistor Q1 the base of which is connected through resistor R1 (50K ohms) to a first voltage potential $V_{ss}$. ($V_{ss}$ is assumed to be 5 volts in the following description. Of course, $V_{ss}$ could be any other appropriate voltage.) The collector of Q1 is connected to both the base of a third NPN transistor Q3 and the emitter of a fourth NPN transistor Q4. A second input signal B is applied to the emitter of an NPN transistor Q2 the base of which is connected through resistor R2 (50K ohms) to $V_{ss}$. The collector of Q2 is connected to both the base of NPN transistor Q4 and the emitter of NPN transistor Q3. The collectors of NPN transistors Q3 and Q4 are connected to a first node 1. Q1, Q2, Q3, and Q4 are all Schottky clamped.

Node 1 will sink current from a positive source if one and only one of the input voltages is a logical "1" (i.e., a "high" voltage). This result can be seen by examining three cases. In the case when a logical "0" (i.e., a "low" voltage) is applied to the first input terminal A and a logical "1" is applied to the second input terminal B, the signal on terminal A turns on transistor Q1. The high signal on terminal B turns off transistor Q2. The logical "0" at the collector of transistor Q1 both turns off transistor Q3 and drains current from transistor Q4, which is on because a logical "1" is applied to its base by the collector of transistor Q2. The on state of transistors Q1 and Q4 causes the voltage level at node 1 to be "low", equal to two collector-emitter saturation voltage drops (i.e., the saturation voltage drops across Q1 and Q4) above the input voltage at terminal A. In a typical case using Schottky transistors which have a base-emitter drop of 0.8 volts and a base-collector drop of 0.6 volts, the collector-emitter drop during saturation is 0.2 volts. If the low input voltage at terminal A is 0.2 volts, the voltage level at node 1 is 0.6 volts. From the symmetry of the exclusive-or circuitry generated by transistors Q1, Q2, Q3 and Q4 of FIG. 2, it is apparent that the voltage level on node 1 is the same in the case when the input signals at the first and second terminals are reversed from the situation just described.

In a second case, when high signals are applied to both input terminals A and B, transistors Q1 and Q2 are off, and the base voltages on transistors Q3 and Q4 are high. But since the emitter voltages of transistors Q3 and Q4 are equally high, transistors Q3 and Q4 are off and the voltage on node 1 is pulled up by current through feedback transistor Q5 and feedback resistor R3 (10K ohms). When node 1 is high, transistors Q6 and Q8 turn on and the voltage on node 1 is given by the voltage drops across the base-emitter junctions of the two forward-biased NPN transistors Q6 and Q8.

In a third case, when low signals are applied to both input terminals A and B, transistors Q1 and Q2 both turn on, and the base voltages of transistors Q3 and Q4 are low. Thus Q3 and Q4 are off, and again the voltage at node 1 is pulled up by current through feedback transistor Q5 and feedback resistor R3.

Figure 1A:
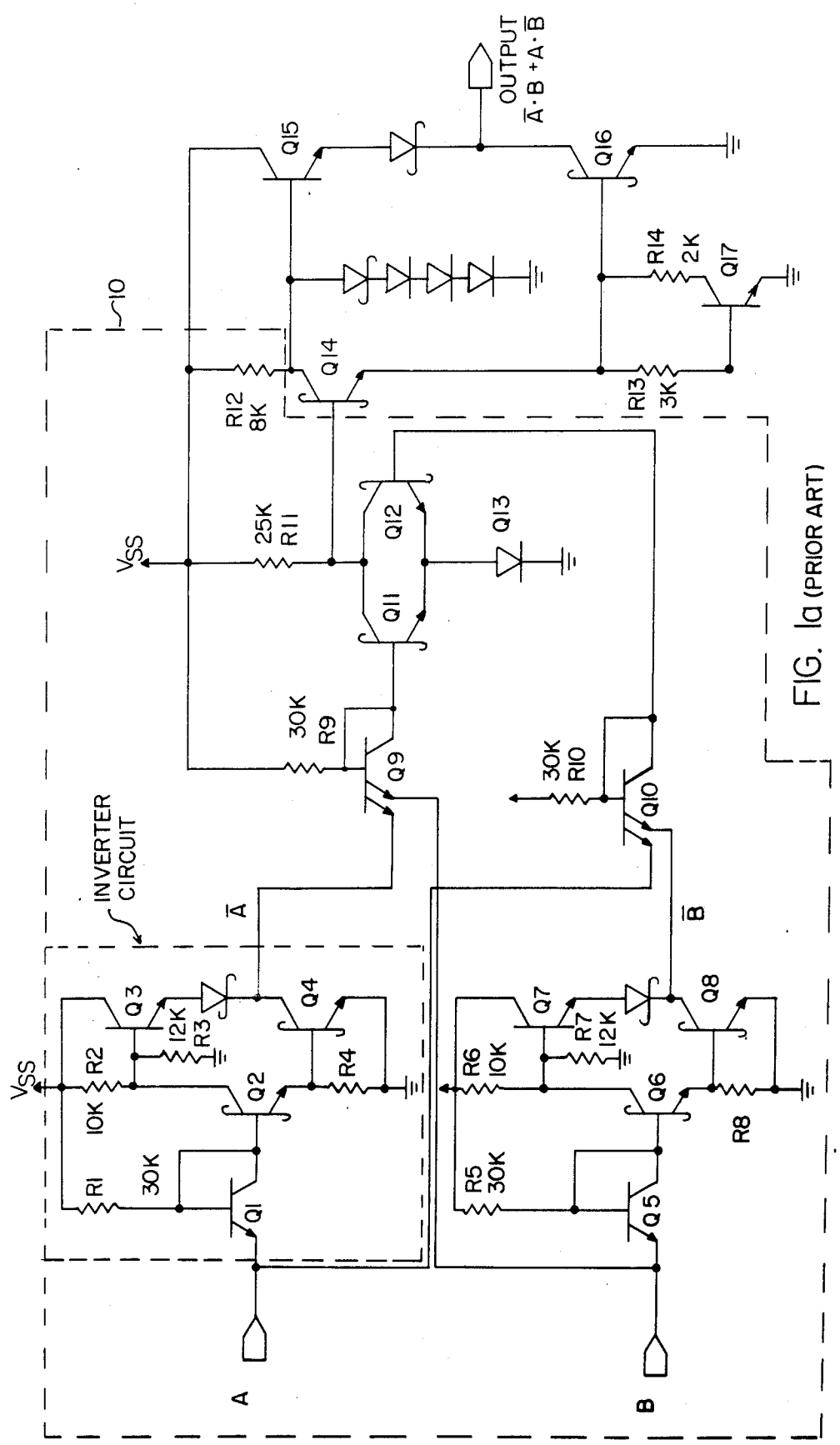
FIG. 1a shows an exclusive-or circuit of the prior art; the transistor symbols used for transistors Q2, Q4, and others represent Schottky-clamped transistors having a metal piece connected between base and collector of those transistors. Transistors Q1 and Q3 are not shown as Schottky clamped transistors.

Thus with the use of only four transistors in an arrangement with only two propagation delays associated with the inversion of a switching transistor, as compared to thirteen transistors and five delays in a circuit of the prior art (FIG. 1a), a status is generated at node 1 as shown in the truth table, Table 1.

Figure 1B:
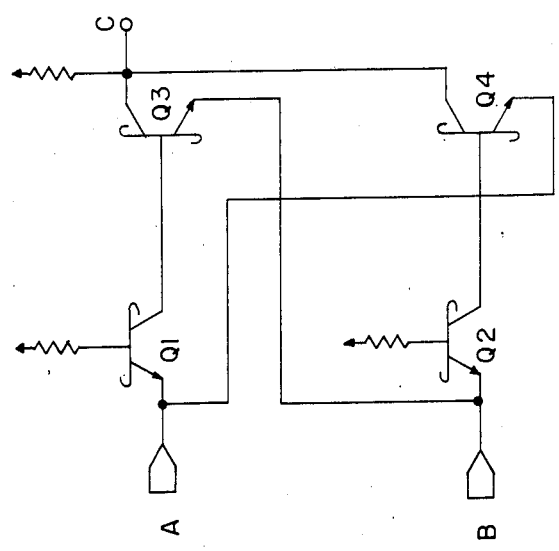
FIG. 1b shows the logic portion of a prior art exclusive-or circuit in which logic signals control two leads of the switching transistors.

Prior art, as described in FIG. 1b, also uses four transistors, but in a configuration which limits its ability to be combined in successive sub-stages using only two transistors per sub-stage.

TABLE 1

| A | B | Node 1 |
|---|---|--------|
| 0 | 0 | 1 |
| 0 | 1 | 0 |
| 1 | 0 | 0 |
| 1 | 1 | 1 |

Another improvement of this invention makes use of a feedback transistor to reduce voltage swing during switching.

Node 1 is connected through feedback resistor R3 (10K ohms) to the emitter of feedback transistor Q5 which has its collector connected to $V_{ss}$ and its base connected to node 2 which is in turn connected through resistor R4 (4K ohms) to $V_{ss}$ and through resistor R5 (4K ohms), to node 3. Node 1 is connected to the base of transistor Q6 which has its collector connected to node 3 which is in turn connected to the base of a pull-up transistor Q7 and to ground through series-connected diodes D1, D2, D3 and D4. The emitter of transistor Q6 is connected to the base of a pull-down output transistor, Q8. The base and collector of pull-down transistor Q9 are connected to the base of Q8 through resistors R6 (3K ohms) and R7 (2K ohms), respectively.

A significant characteristic of the two-input circuit of FIG. 2 in providing the second improvement of this invention is the arrangement of transistors Q5 and Q6. When a "high" signal exists at node 1 a very small voltage drop is generated across resistor R3. In the circuit of FIG. 2, the voltage of a logical "1" at node 1 would be about 1.6 volts, just two base-emitter voltage drops above the second voltage potential (ground) when transistors Q6 and Q8 are forward biased. In this case, the voltage level at node 3 is about 1.0 volts, assuming transistor Q6 has a collector-emitter drop during the on-state of 0.2 volts. Assuming resistors R4 and R5 are of equal size, the voltage at node 2 is about 3.0 volts. Therefore the voltage level at the emitter of Q5 is about 2.2 volts. This means R3 sustains a voltage drop of some 0.6 volts. A resistor R3 of 10K ohms would produce a current of some 60 microamps as base drive to Q6 which is lower than the saturation current needed to turn Q6 fully on. In this situation, a change in the input signals on terminals A and B which causes the voltage on node 1 to go low will very quickly turn off Q6.

When the signals at terminals A and B are of opposite states so that a low signal exists at node 1, there is a much larger voltage drop across R3 than when a high signal exists at node 1. In this situation Node 1 is at a voltage level of about 0.6 volts as determined by 0.2 volt collector-emitter drops of Q1 and Q4 (or alternatively Q3 and Q2) above the low (0.2 volt) input signal on one of the other of input terminal A and B. This causes Q6 to be off. The voltage at node 3 is at a level determined by the diode string D1–D4 which in the example of FIG. 2 is about 3.0 volts. In turn, the voltage level at node 2 is about 4.0 volts, bringing the emitter of Q5 to some 3.2 volts. Thus R3 sustains a voltage drop of some 2.6 volts and carries a current to one of the input terminals of some 260 microamps. This much higher current is then available to quickly turn on Q6 in response to a change in the input signals on terminals A and B which causes a change in the voltage on node 1.

Figure 3:
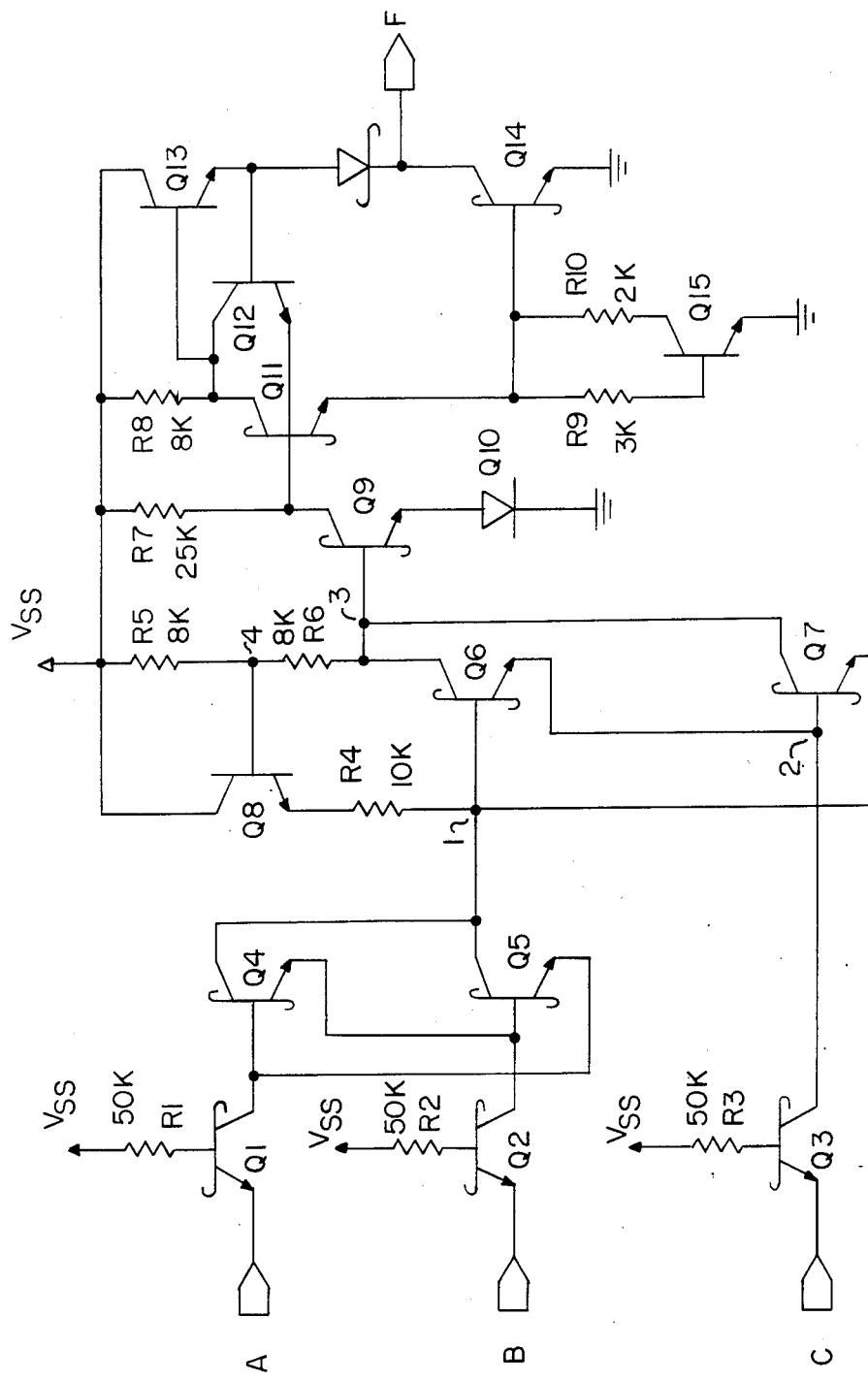
FIG. 3 shows a three-input embodiment of this invention which inserts the logic of the third input before the output circuitry.

A further improvement of this invention will be described in conjunction with a three-input embodiment of the invention (FIG. 3). This three-input embodiment also incorporates the exclusive-or logic and the feedback circuit described above. A circuit of this invention allows multiple input signals to be used to generate a single exclusive-or logic signal to the transistor that controls the signal on the output terminal F. In the three input terminal embodiment of FIG. 3, a single exclusive-NOR signal is generated at node 1 for the first two input signals on input terminals A and B in the manner described above in conjunction with FIG. 2. The third input terminal, C, is connected to the emitter of an input controlling transistor Q3 which has its base connected to a positive voltage potential $V_{ss}$ and its collector connected to a second node, 2. Node 1 is connected through a resistor, R4, to the emitter of a feedback transistor, Q8, to the base of second-stage transistor Q6 and to the emitter of a second second-stage transistor Q7. Transistors Q6 and Q7 are part of a second state of exclusive-NOR logic. Node 2 is connected to both the base of Q7 and the emitter of Q6. The collectors of Q6 and Q7 are connected to a third node, 3, on which is provided a single exclusive-or signal to the output stage of this circuit.

Table II shows the truth table for the three-input embodiment of FIG. 3.

Four cases will be described to show the operation of the embodiment of FIG. 3. These four cases are identified in Table II.

TABLE II

| A | B | C | Node 1 | Node 2 | Node 3 | Case |
|---|---|---|--------|--------|--------|------|
| 0 | 0 | 0 | 1      | 0      | 0      | 1    |
| 0 | 0 | 1 | 1      | 1      | 1      | 4    |
| 0 | 1 | 0 | 0      | 0      | 1      | 3    |
| 0 | 1 | 1 | 0      | 1      | 0      | 2    |
| 1 | 0 | 0 | 0      | 0      | 1      | 3    |
| 1 | 0 | 1 | 0      | 1      | 0      | 2    |
| 1 | 1 | 0 | 1      | 0      | 0      | 1    |
| 1 | 1 | 1 | 1      | 1      | 1      | 4    |

Truth Table for 3 Nodes of FIG. 3.

In the first case where the signal at node 1 is a logical "1" (i.e., the input signals on terminals A and B are identical being either "0" or "1" and the signal at node 2 is a logical "0" meaning the input signal on terminal C is low, the voltage level at node 1 will be controlled by the base-emitter drop of Q6 and the collector-emitter drop of Q3. If the low input signal on input terminal C is 0.2 volts, the voltage level at node 1 is about 1.2 volts and the voltage level at node 2 is about 0.4 volts. In this case Q6 is "on" and Q7 is "off". Therefore Q6 drains the base of Q9 to about 0.6 volts, turning it off.

In a second case, where the signal at node 1 is a logical "0" (i.e., the input signals on input terminals A and B are different) and the signal at node 2 is a logical 37 1" the voltage level at node 1 will be two collector-emitter voltage drops at saturation above the low input terminal (A or B), or about 0.6 volts. Node 2 will be one base-emitter drop above this, or about 1.4 volts. Current will pass through Q7, through node 1, and out through the low-state input terminal (A or B). This will cause the voltage level at the base of Q9 to be about 0.8 volts, or three collector-emitter drops above the voltage at the low-state input terminal, thus turning off Q9, just as in the case above.

In a third case, where the signals at nodes 1 and 2 are both logical "0", the voltage level at node 2 will be one collector-emitter drop at saturation above the low input voltage (typically 0.2 volts) at input terminal C, or about 0.4 volts in this example. The voltage at node 1 will be two collector-emitter drops at saturation above that at the low input terminal A or B, or in this example, about 0.6 volts. Since this 0.2 volt difference is less than the turn-on drop of 0.8 volts, both Q6 and Q7 will be off, and the voltage at the base of Q9 will be pulled up to a logical "1" through resistors R5 and R6.

In a fourth case, where the signals at nodes 1 and 2 are both logical "1", no current will flow through Q6 and Q7 because the base-emitter voltage drop is again less than the needed 0.8 volts. When the current does not flow through Q6 and Q7, the voltage level at the base of Q9 is again pulled up through R5 and R6 to a logical "1".

These four cases demonstrate the incorporation of exclusive-or logic from three input signals into a single signal which is then used to control the output portion of the exclusive-or circuit.

Figure 4A:
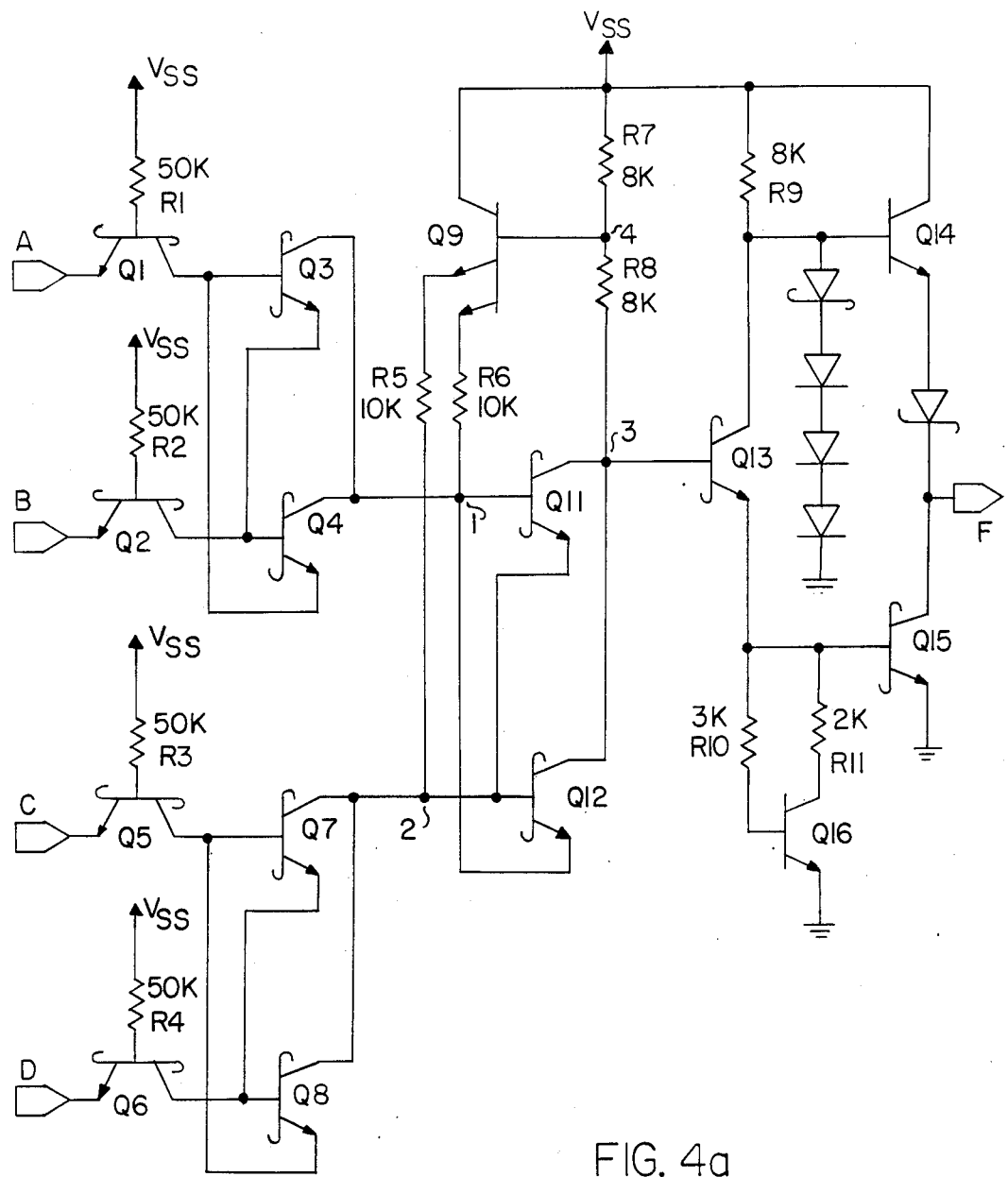
FIG. 4a shows a four-input embodiment of this invention which uses the logic circuitry of this invention at three places, uses a feedback transistor between the first and second logic levels and generates an exclusive-or signal from four input signals to control the output circuitry.

A description of the operation of a four-input embodiment (FIG. 4a) of an exclusive-or circuit of this invention, using the feedback circuit of this invention and creating from the four input signals a single signal to the output buffer will further demonstrate the principles of this invention. In the embodiment of FIG. 4a, a first input terminal, A, is connected to the emitter of a first input controlling transistor, Q1 which has its base connected to a positive voltage potential, $V_{ss}$, and its collector to the base of a first logic transistor Q3 and the emitter of a second logic transistor, Q4. A second input terminal, B, is connected to the emitter of a second input controlling transistor, Q2 which has its base connected to $V_{ss}$ and its collector to the base of Q4 and the emitter of Q3. The collectors of Q3 and Q4 are connected to a first node, 1. A third and fourth input terminal, C and D, are connected in identical fashion, with the collectors of third and fourth logic transistors, Q7 and Q8, connected to a second node 2. Node 1 is connected to the base of a first second-stage logic transistor, Q11, and the emitter of a second second-stage logic transistor, Q12. Node 1 is also connected through a feedback resistor, R6, to an emitter of a double-emitter feedback transistor, Q9. Node 2 is connected to the base of Q12 and the emitter of Q11. Node 2 is also connected through a feedback resistor, R5, to another emitter of Q9. The collector of transistor Q9 is connected to $V_{ss}$. The base of Q9 is connected to a fourth node, 4, which is connected through a resistor, R7, to $V_{ss}$ and through a resistor, R8, to a third node, 3. The collectors of Q11 and Q12 are connected to node 3. Node 3 controls the base of an output controlling transistor, Q13.

The above circuit uses two successive sub-stages of exclusive-or logic as described above in conjunction with FIGS. 2 and 3 and it generates a single signal to an output controlling transistor Q13.

Figure 4B:
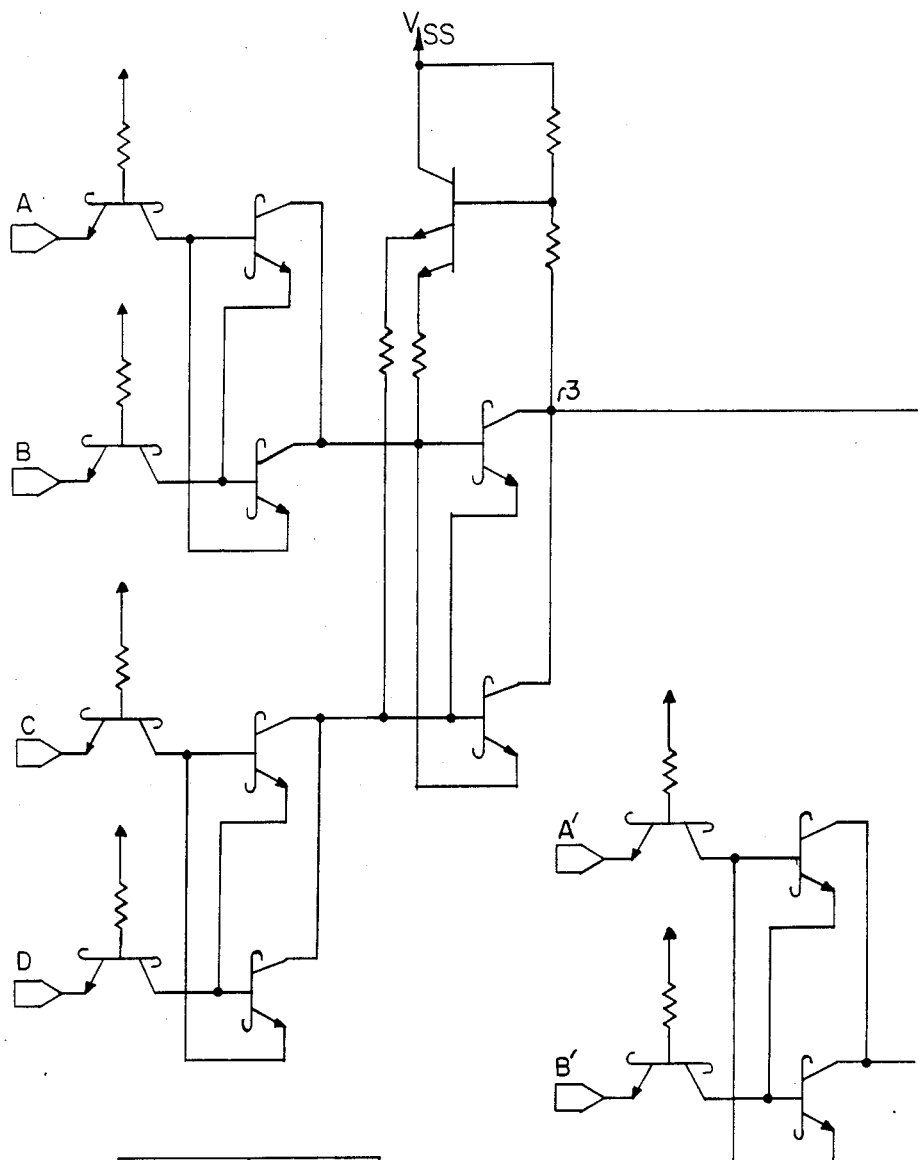
FIG. 4b shows an 8-input embodiment of this invention.
Figure 4B:
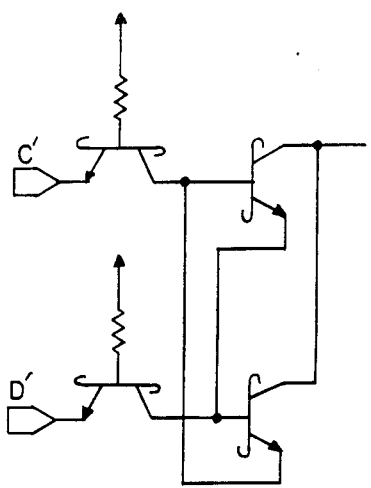
Figure 5:
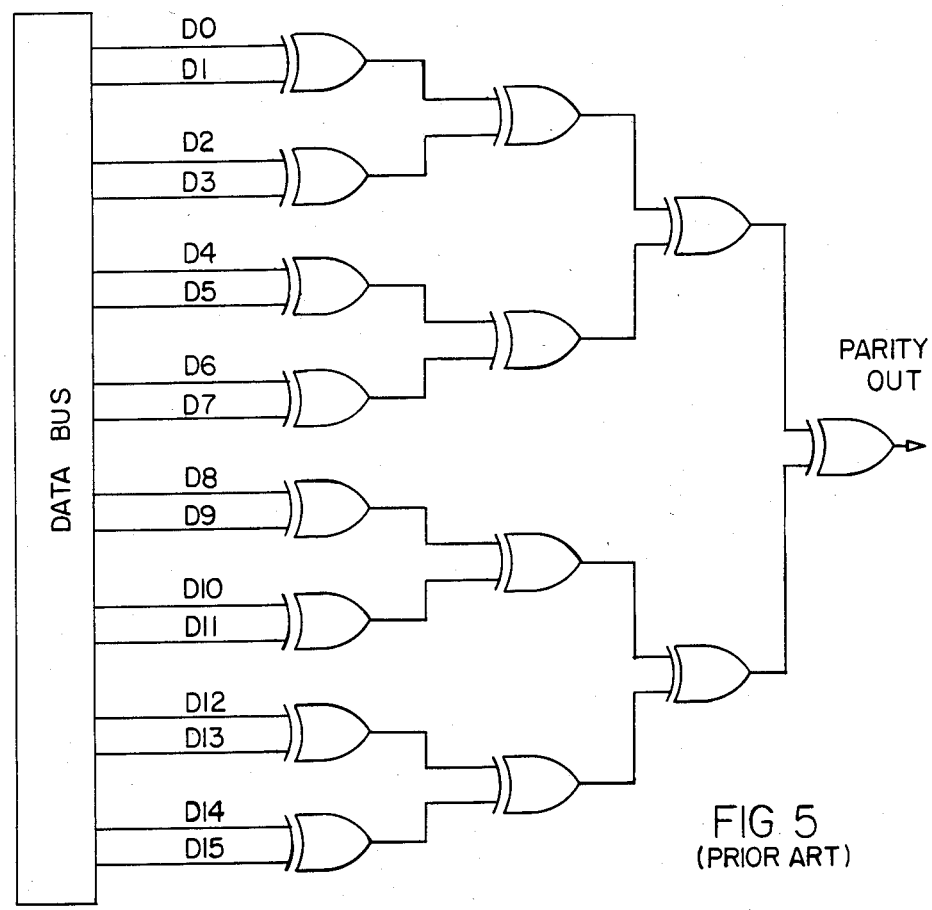
FIG. 5 shows a logic diagram using 16 input bits processed through four stages of a prior art circuit.
Figure 6:
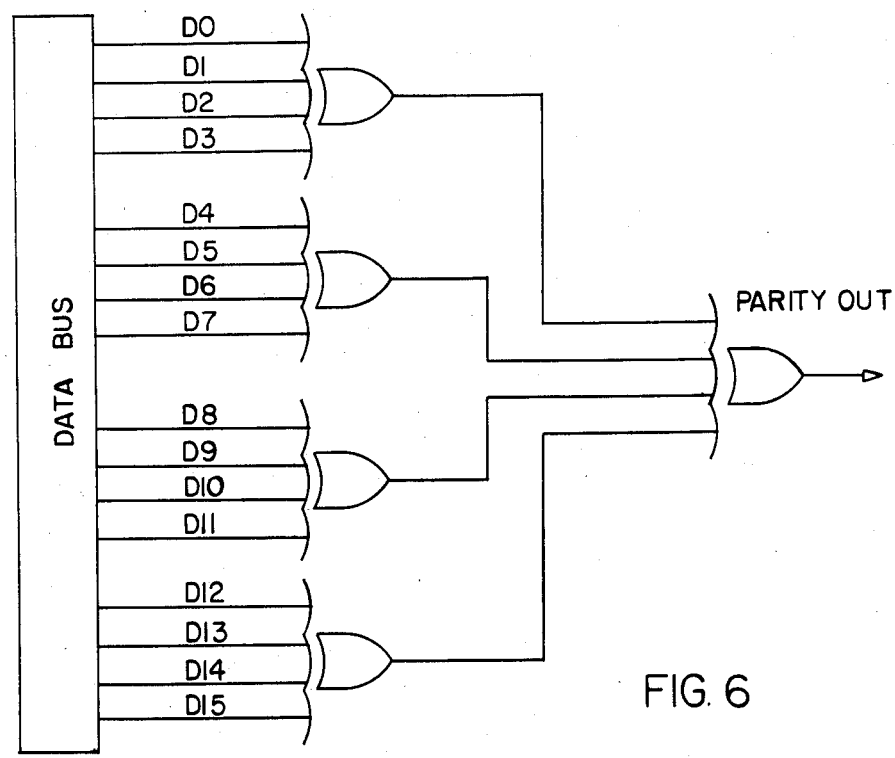
FIG. 6 shows a logic diagram using 16 input bits processed through two stages of the four-input circuit of FIG. 4.
Figure 7:
FIG. 7 shows a performance table of the prior art, indicating the number of component parts required in the manufacture of a prior art circuit using 2, 3, 4, and 16 input signals, the switching time of the circuit for 2, 3, 4 and 16 input signals, and the logical representation of these input configurations.
Figure 7:
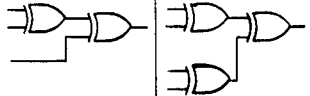
Figure 7:

The embodiment of FIG. 4a shows application of the feature of this invention which reduces voltage swing through dual emitter feedback transistor Q9. The function of Q9 is identical to the function of the single-emitter transistor, Q5, shown in FIG. 2 for the two-input embodiment in the cases when the first and second nodes of FIG. 4 are the same, either high or low. Therefore these cases will not be described again. In the case where node 1 of FIG. 4 is high and node 2 is low, the voltage level of node 2 will be two collector-emitter drops above a low input voltage, which in the case we have been describing is about 0.6 volts. The voltage level at node 1 will be one base-emitter drop above that at node 2, or about 1.4 volts, and the voltage level at node 3 will be one collector-emitter drop above node 1 or about 0.8 volts. Assuming the resistors connected to node 4 are equal, and $V_{ss}$ is 5 volts, a voltage of about 0.8 volts at node 3 causes the voltage at node 4 to be at about 2.9 volts and at the emitters of Q9 to be about 2.1 volts. Since this produces a voltage drop of some 1.5 volts across R5, and a drop of only some 0.7 volts across R6, more current will flow through node 2 and this current will be available to cause a quick turn-on of Q12 in response to a change at terminals C or D. The smaller current at node 1 will allow for a quick turn-off in response to a change at input terminals A or B. The equivalent result would occur if the states of nodes 1 and 2 were reversed.

The number of input leads per stage is not limited to four. If desired, for example, the number of input leads per stage can be increased to 8, as shown in FIG. 4b, by replicating input leads A, B, C and D of FIG. 4a and the circuitry associated therewith and up through node 3 and then connecting the outputs from each of the circuits comprising input leads A, B, C, D and the associated transistors to an additional pair of switching transistors such as transistors Q3 and Q4 as shown in FIG. 2. The output circuitry then would be modified as shown in FIG. 4b. Diode D1, is added to perform a level shifting function to insure that the voltage on the emitter of Q6 will be about 1.6 volts and that Q6 remains off until its base voltage rises to more than four collector-emitter voltage drops above a low input signal level. Diodes D2 and D3 are added to assure that transistor Q7 remains off when Q6 is on.

Figure 8:
FIG. 8 shows a performance table for the current invention indicating the number of component parts required in the manufacture of circuits using 2, 3, 4, and 16 input signals, the switching time of the circuit for 2, 3, 4, and 16 input signals and the logic representation of these input configurations.
Figure 8:
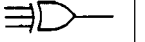
Figure 8:
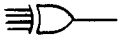

The circuitry of FIG. 4b when used for 16 input signals improves the time delay somewhat over the values shown in FIG. 8. Time delay improvements over prior art are greater for larger numbers of input signals to be processed.

As will be seen from the above description, an exclusive-or gate is achieved with increased packing density because the resulting circuit includes substantially fewer components than conventional prior art. The logic portion of a two-input circuit, rather than having 24 active devices, as shown in portion 10 of the prior-art circuit of FIG. 1a, has only 10 active devices, as shown in portion 20 of FIG. 2. Thus the circuitry lends itself to a more compact implementation in integrated circuit form than the prior art circuits and thus to a higher packing density per gate.

Because the packing density is increased, the chip size is smaller for a given number of gates and thus the circuit can be made with higher yields than prior art circuits. As is well-known in the semiconductory industry, if the defect density is constant, smaller dice provide higher yields.

Furthermore, by use of the switching transistor and feedback circuit involving, as shown in FIG. 2, transistor Q5 and resistor R3, the voltage swing at the base of transistor Q6 to switch it from one state to the other (i.e. on or off) is kept much smaller than in the prior art. Therefore, transistor Q6 stores less charge on its base-collector and base-emitter junctions and is able to switch more rapidly than the same size transistor operated in a prior art circuit.

Finally, the circuit uses less power than prior art exclusive-or circuits because it uses fewer devices and because feedback transistor Q5 and resistor R3, together with the smaller voltage swings on node 1, reduce the current passing through node 1 and therefore the amount of power consumed by the circuit.

While several embodiments of this invention have been described, other embodiments will be obvious to those skilled in the art in view of the above disclosure.

What is claimed is:

1. An exclusive-or gate circuit comprising:
an exclusive-nor gate logic circuit having at least first and second input terminals and an output node; and
an inverter gate circuit having an input terminal coupled to said output node of said exclusive-nor logic circuit, whereby said inverter gate produces an output that represents the exclusive-nor function of said first and second input terminals, wherein said exclusive-nor logic circuit comprises:
first, second, third, and fourth transistors, each having emitter, base, and collector electrodes;
means coupling the emitter of said first transistor to said first input terminal;
means coupling said base of said first transistor to a first voltage source;
means coupling said collector of said first transistor to said base of said third transistor and to said emitter of said fourth transistor;
means coupling said emitter of said second transistor to said second input terminal;
means coupling said base of said second transistor to said first voltage source;
means coupling said collector of said second transistor to said base of said fourth transistor and to said emitter of said third transistor; and
means coupling said collectors of said third and fourth transistors together to comprise said exclusive-nor logic circuit output and to load means for coupling said output to said first voltage source;
said load means comprise fifth and sixth transistors, each one having emitter, base and collector electrodes;
means coupling said emitter of said fifth transistor, through a series resistor, to said exclusive-nor logic circuit output node;
means coupling said collector of said fifth transistor to said first voltage source;
means coupling said base of said sixth transistor to said exclusive-nor logic circuit output node;

means including a resistor voltage divider having a tap, coupled between said collector of said sixth transistor and said first voltage source; and means coupling said base of said fifth transistor to said tap on said resistor voltage divider whereby said exclusive-or gate circuit includes a speed up feedback circuit.

2. The exclusive-or gate circuit of claim 1 further comprising:

seventh and eighth transistors each one having emitter, base and collector electrodes;

means coupling said emitter of said seventh transistor to said inverter gate output;

means coupling said collector of said seventh transistor to said first voltage source;

means coupling said base of said seventh transistor to said collector of said sixth transistor;

means coupling said collector of said eighth transistor to said inverter gate output;

means coupling said emitter of said eighth transistor to a second voltage source; and means coupling said base of said eighth transistor to said emitter of said sixth transistor whereby said seventh and eighth transistors comprise pull up and pull down elements respectively of said inverter gate circuit.

3. The exclusive-or gate circuit of claim 2 further comprising a plurality of series connected diodes coupled between said second voltage source and said base of said seventh transistor, said diodes being poled to conduct the current supplied by said first voltage source, whereby the signal swing of said circuit is limited.

4. The exclusive-or gate circuit of claim 3 wherein at least one diode of said plurality is a Schottky diode and said first, second, third, fourth, sixth and eighth transistors are Schottky transistors.

* * * * *